(12) United States Patent
Yoo

(10) Patent No.: US 10,847,506 B2
(45) Date of Patent: Nov. 24, 2020

(54) METHOD FOR FABRICATING HIGH-EFFICIENCY MICRO-LED MODULE

(71) Applicant: LUMENS CO., LTD., Yongin-si (KR)

(72) Inventor: Taekyung Yoo, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 54 days.

(21) Appl. No.: 16/185,979

(22) Filed: Nov. 9, 2018

(65) Prior Publication Data

US 2019/0164947 A1 May 30, 2019

(30) Foreign Application Priority Data

Nov. 24, 2017 (KR) .......................... 10-2017-0158825

(51) Int. Cl.
*H01L 33/62* (2010.01)
*H01L 25/18* (2006.01)
(Continued)

(52) U.S. Cl.
CPC .............. *H01L 25/18* (2013.01); *H01L 24/11* (2013.01); *H01L 24/13* (2013.01); *H01L 24/73* (2013.01);
(Continued)

(58) Field of Classification Search
CPC ......... H01L 24/11; H01L 24/13; H01L 24/16; H01L 24/73; H01L 24/81; H01L 25/18; H01L 33/0093; H01L 33/62
(Continued)

(56) References Cited

U.S. PATENT DOCUMENTS

| 2005/0253161 | A1* | 11/2005 | Horio | .................... | H01L 33/08 257/100 |
| 2007/0176188 | A1* | 8/2007 | Tanaka | ................... | H01L 33/46 257/88 |
| 2014/0239318 | A1* | 8/2014 | Oyu | ....................... | H01L 24/82 257/88 |

FOREIGN PATENT DOCUMENTS

| JP | 2012-507848 A | 3/2012 |
| JP | 2015-12185 A | 1/2015 |
| JP | 2015-61010 A | 3/2015 |

* cited by examiner

Primary Examiner — Long K Tran
(74) Attorney, Agent, or Firm — Mei & Mark LLP

(57) ABSTRACT

Disclosed is a method for fabricating a high-efficiency micro-LED module. The method includes: preparing a micro-LED in which an epilayer is grown on a sapphire substrate, a plurality of LED cells are formed on the epilayer, a plurality of individual electrode pads are disposed such that one individual electrode pad is assigned to each LED cell, and a common electrode pad is formed on an area surrounding the plurality of LED cells; preparing a submount substrate including a plurality of individual electrodes corresponding to the individual electrode pads and a common electrode corresponding to the common electrode pad; mounting the micro-LED on the submount substrate such that the plurality of individual electrodes are connected to the plurality of individual electrode pads and the common electrode pad is connected to the common electrode through a plurality of bonding connection members; forming a buffer layer between the micro-LED and the submount substrate; and irradiating a laser around the boundary between the sapphire substrate and the epilayer to separate the sapphire substrate from the epilayer, wherein the buffer layer absorbs energy produced by the laser at least between the neighboring LED cells to protect the epilayer or the surmount substrate from damage.

19 Claims, 5 Drawing Sheets

(51) Int. Cl.
*H01L 33/00* (2010.01)
*H01L 23/00* (2006.01)
H01L 27/092 (2006.01)
H01L 27/15 (2006.01)
H01L 33/56 (2010.01)

(52) U.S. Cl.
CPC .......... *H01L 24/81* (2013.01); *H01L 33/0093* (2020.05); *H01L 33/62* (2013.01); *H01L 27/092* (2013.01); *H01L 27/156* (2013.01); *H01L 33/56* (2013.01); *H01L 2224/1146* (2013.01); *H01L 2224/1357* (2013.01); *H01L 2224/13147* (2013.01); *H01L 2224/13639* (2013.01); *H01L 2224/13647* (2013.01); *H01L 2224/73204* (2013.01); *H01L 2224/81224* (2013.01); *H01L 2224/81815* (2013.01); *H01L 2933/0066* (2013.01)

(58) Field of Classification Search
USPC ..................................................... 438/22, 24
See application file for complete search history.

METHOD FOR FABRICATING HIGH-EFFICIENCY MICRO-LED MODULE

BACKGROUND OF THE INVENTION

1. Field of the Invention

The present invention relates to a method for fabricating a micro-LED module by mounting a micro-LED constructed using a sapphire substrate as a growth substrate on a submount substrate, and more specifically to a method for fabricating a micro-LED module in which a micro-LED is mounted on a submount substrate and a sapphire substrate of the micro-LED is removed by a laser lift-off process to prevent the light extraction efficiency of a final micro-LED module from deterioration resulting from the use of the sapphire substrate while protecting an epilayer of the micro-LED and/or a circuit of the submount substrate between LED cells of the micro-LED from laser-induced damage.

2. Description of the Related Art

Studies on methods for fabricating micro-LED modules are currently underway by the applicant of the present invention. Micro-LED modules under study are fabricated by flip-chip bonding a micro-LED including a plurality of LED cells to a submount substrate. The micro-LED includes a sapphire substrate and a gallium nitride semiconductor light emitting unit formed on the sapphire substrate and having a plurality of LED cells. The semiconductor light emitting unit includes an exposed area of an n-type semiconductor layer formed by etching and the plurality of LED cells are arrayed in a matrix on the exposed area of the n-type semiconductor layer. Each of the LED cells includes an n-type semiconductor layer, an active layer, and a p-type conductive semiconductor layer. A p-type electrode pad is disposed on the p-type semiconductor layer of each LED cell. An n-type electrode pad is disposed on the exposed area of the n-type semiconductor layer. The submount substrate includes a plurality of electrodes disposed corresponding to the electrode pads of the micro-LED. The micro-LED is flip-chip bonded to the mount substrate using solder bumps so that the electrode pads of the micro-LED are connected to the electrodes of the submount substrate. In the micro-LED module, the plurality of LED cells are integrated with the overlying sapphire substrate as a growth substrate. When power is applied to the plurality of LED cells through the electrodes of the submount substrate and the electrode pads of the micro-LED, the plurality of LED cells emit light. The light generated from the LED cells, particularly the active layers of the LED cells, is emitted through the sapphire substrate. Thus, the sapphire substrate is a major cause of light loss. When the micro-LED module is applied to a small-sized display device, the direction of propagation of light from the LED cells is largely changed during passage through the sapphire substrate, causing serious image quality deterioration. As a solution to these problems, the removal of the sapphire substrate before mounting of the micro-LED on the submount substrate is considered. However, the removal of the sapphire substrate from the micro-LED is accompanied by considerable bending of the micro-LED. The sapphire substrate is commonly removed by applying a laser to the boundary between the semiconductor layer and the sapphire substrate, more specifically allowing the undoped semiconductor layer to absorb laser energy. The small thickness (~2 μm) of the epilayer between the neighboring LED cells increases the risk that the laser energy may cause damage to a circuit on the submount substrate as well as damage to the epilayer.

SUMMARY OF THE INVENTION

It is one object of the present invention to provide a method for fabricating a micro-LED module in which after stable bonding between a micro-LED and a submount substrate is ensured, a sapphire substrate of the micro-LED is removed by a laser lift-off process to prevent the light extraction efficiency of a final micro-LED module from deterioration resulting from the use of the sapphire substrate.

It is another object of the present invention to provide a method for fabricating a micro-LED module in which a sapphire substrate is removed from a micro-LED bonded with a submount substrate by a laser lift-off process to protect the micro-LED or the submount substrate between neighboring LED cells from laser-induced damage.

A method for fabricating a micro-LED module according to one aspect of the present invention includes: preparing a micro-LED in which a semiconductor layer is formed on a sapphire substrate, a plurality of LED cells are formed on the semiconductor layer, and a plurality of electrode pads are disposed such that one electrode pad is assigned to each LED cell; preparing a submount substrate including a plurality of electrodes corresponding to the electrode pads; mounting the micro-LED on the submount substrate such that the plurality of electrode pads are connected to the plurality of electrodes through a plurality of bonding connection members; forming a buffer layer between the micro-LED and the submount substrate; and irradiating a laser between the sapphire substrate and the semiconductor layer to separate the semiconductor layer from the sapphire substrate, wherein the buffer layer absorbs energy produced by the laser at least between the neighboring LED cells.

According to one embodiment, the micro-LED preparation includes: forming an undoped semiconductor layer, an n-type semiconductor layer, an active layer, and a p-type semiconductor layer as constituent parts of the semiconductor layer and etching the semiconductor layer to a predetermined depth to form n-type trenches isolating a plurality of LED cells and an n-type outer area surrounding the outermost ones of the plurality of LED cells; and forming an individual electrode pad on the p-type semiconductor layer of each of the plurality of LED cells and forming a common electrode pad on the n-type outer area, and the submount substrate preparation includes forming individual electrodes corresponding to the individual electrode pads and a common electrode corresponding to the common electrode pad.

According to one embodiment, the buffer layer includes an inner side portion surrounding inner bonding connection members connecting the plurality of individual electrode pads to the plurality of individual electrodes and an outer side portion surrounding an outer bonding connection member connecting the common electrode pad to the common electrode.

According to one embodiment, the buffer layer includes an outermost portion surrounding the side surfaces of the micro-LED.

According to one embodiment, the buffer layer formation includes: filling an adhesive in the form of a liquid or gel between the micro-LED and the submount substrate after solders for forming the plurality of bonding connection members are melted and cured; and curing the adhesive.

According to one embodiment, the micro-LED preparation includes designing the individual electrode pads and the common electrode pad to have different thicknesses such that the end surfaces of the individual electrode pads lie in the same plane as the end surface of the common electrode pad.

According to one embodiment, the micro-LED preparation further includes forming an electrically insulating cell cover layer including first pad exposure holes through which the individual electrode pads are exposed and a second pad exposure hole through which the common electrode pad is exposed.

According to one embodiment, the sapphire substrate removal includes removing the sapphire substrate together with the undoped semiconductor layer by irradiation with a laser at a wavelength that passes through the sapphire substrate and is absorbed by the undoped semiconductor layer and removing the undoped semiconductor layer remaining in the epilayer by etching.

According to one embodiment, the buffer layer is formed at a height below the boundary between the n-type semiconductor layer and the sapphire substrate to cover the side surfaces of the n-type semiconductor layer.

According to one embodiment, each of the plurality of bonding connection members includes a solder and the micro-LED mounting includes heating the individual electrode pads with a laser that is irradiated from above the micro-LED, penetrates the LED cells, and reaches the individual electrode pads to melt the solders.

A high efficiency LED module according to a further aspect of the present invention includes: a micro-LED including an n-type semiconductor layer, a plurality of LED cells, each of which is formed on one surface of the n-type semiconductor layer and includes an active layer and a p-type semiconductor layer, individual electrode pads, each of which is formed on the p-type semiconductor layer of each of the plurality of LED cells, and a common electrode pad formed on an n-type area surrounding the outermost ones of the plurality of LED cells; a submount substrate including individual electrodes corresponding to the individual electrodes, a common electrode corresponding to the common electrode pad, and bonding connection members disposed between the individual electrodes and the individual electrode pads and between the common electrode and the common electrode pad; and a buffer layer formed between the micro-LED and the submount substrate, wherein a sapphire substrate is removed from the other surface of the n-type semiconductor layer by laser irradiation between the n-type semiconductor layer and the sapphire substrate and wherein the buffer layer absorbs energy produced by the laser between the neighboring LED cells to protect the micro-LED or submount substrate from laser-induced damage.

According to another aspect of the present invention, there is provided a method for fabricating a micro-LED module, including: preparing a micro-LED in which a semiconductor layer is formed on a sapphire substrate, a plurality of LED cells are formed on the semiconductor layer, and a plurality of electrode pads are disposed such that one electrode pad is assigned to each LED cell; preparing a submount substrate including a plurality of electrodes corresponding to the electrode pads; mounting the micro-LED on the submount substrate such that the plurality of electrode pads are connected to the plurality of electrodes through a plurality of bonding connection members; forming a buffer layer between the micro-LED and the submount substrate; and irradiating a laser between the sapphire substrate and the semiconductor layer to separate the semiconductor layer from the sapphire substrate, wherein the sum of the bonding strength between the micro-LED and the sub-mount through the plurality of bonding connection members and the bonding strength between the micro-LED and the submount substrate through the buffer layer is greater than the tensile strength between the submount substrate and the micro-LED when the sapphire substrate is removed.

According to the method of the present invention, after stable bonding between the micro-LED and the submount substrate is ensured, the sapphire substrate of the micro-LED is removed by a laser lift-off process to prevent the light extraction efficiency of the micro-LED module from deterioration resulting from the use of the sapphire substrate.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Preferred embodiments of the present invention will now be described with reference to the accompanying drawings. It should be noted that the drawings and embodiments are simplified and illustrated such that those skilled in the art can readily understand the present invention, and therefore, they should not be construed as limiting the scope of the present invention.

Figure 1:
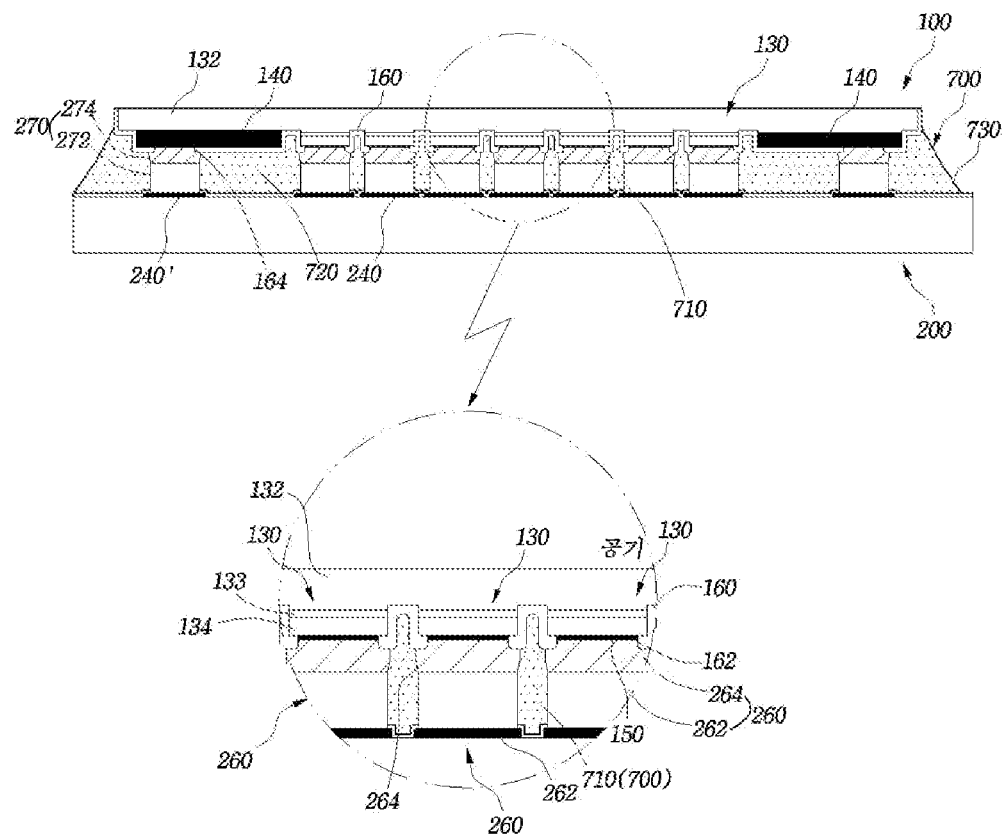
FIG. 1 illustrates a micro-LED module according to one embodiment of the present invention.

Referring to FIG. 1, a micro-LED module according to one embodiment of the present invention includes at least one micro-LED 100 including a plurality of LED cells 130 arrayed in a matrix and a submount substrate 200 mounted with the micro-LED 100. The micro-LED 100 includes at least one common electrode pad 140 disposed in an area corresponding to the peripheral edge thereof. A plurality of individual electrode pads 150 are disposed corresponding to the LED cells 130 arrayed in a matrix. The submount substrate 200 includes pad-type electrodes 240 and 240' formed corresponding to the common electrode pad 140 and the individual electrode pads 150, respectively. As used herein, the term "individual electrode pad" means an electrode pad individually connected to an n-type semiconductor layer or a p-type semiconductor layer provided in one LED cell. As used herein, the term "common electrode pad" means an electrode pad connected in common to n-type or p-type semiconductor layers of several LED cells.

The micro-LED 100 includes an n-type semiconductor layer 132 having a first surface from which the sapphire substrate for growth of the semiconductor layer is removed and a second surface opposite the first surface. The plurality of LED cells 130 are arrayed in a matrix on the second surface of the n-type semiconductor layer 132. Each of the plurality of LED cells 130 includes an active layer 133 and a p-type semiconductor layer 134 grown sequentially in one direction from the n-type semiconductor layer 132. The n-type semiconductor layer 132 may include protrusions protruding from the second surface toward the active layers 133. In this case, the active layers 133 are interposed between the protrusions of the n-type semiconductor layer 132 and the p-type semiconductor layers 134. The sapphire substrate and a buffer layer or undoped semiconductor layer formed to reduce lattice mismatch between the sapphire substrate and the n-type semiconductor layer 132 are removed from the n-type semiconductor layer 132, leaving the first surface of the n-type semiconductor layer 132 exposed.

Due to this structure, an n-type outer area through which the n-type semiconductor layer 132 is exposed is formed surrounding the outermost ones of the LED cells 130 and n-type trenches are formed between the adjacent LED cells 130 to expose the n-type semiconductor layer 132 therethrough. The n-type outer area and the n-type trenches are formed by removing the active layers 133 and the p-type semiconductor layers 134 formed on the n-type semiconductor layer 132 to expose the n-type semiconductor layer 132.

The micro-LED 100 includes an electrically insulating cell cover layer 160 covering the plurality of LED cells 130 and the exposed area of the n-type semiconductor layer 132. The cell cover layer 160 includes pad exposure holes through which the electrode pads 140 and 150 are exposed. The pad exposure holes include a plurality of first pad exposure holes through which the p-type individual electrode pads 150 of the LED cells 130 are exposed and a second pad exposure hole through which the n-type common electrode pad 140 is exposed.

The submount substrate 200 is preferably an active matrix substrate including a plurality of CMOS cells (not illustrated) corresponding to the plurality of LED cells 130 of the micro-LED 100 and a plurality of electrodes 240 and 240' corresponding to the electrode pads of the micro-LED 100. An electrically insulating electrode cover layer is formed in the submount substrate 200 to cover the electrodes 240 and 240'. The electrode cover layer includes electrode exposure holes through which the electrodes 240 and 204' are exposed.

The micro-LED module includes a plurality of bonding connection members 270 and 260 through which the electrodes 240' and 240 of the submount substrate 200 are connected to the electrode pads 140 and 150 of the micro-LED 100, respectively.

Each of the plurality of bonding connection members 270 and 260 includes a bump 270 or 260 connected to and vertically protruding from the corresponding electrode of the submount substrate 200. The bumps 270 and 260 include Cu pillars 272 and 262 and solders 274 and 264 formed on the upper ends of the Cu pillars 272 and 262, respectively. The bumps 270 and 260 including the Cu pillars may also be replaced by bumps including other metal materials.

The solders 274 and 264 are made of SnAg as a solder material and maintain their original hemispherical shapes. When the solders 274 and 264 in a semi-molten state are inserted into the pad exposure holes and are then compressed, they are deformed in the pad exposure holes and are bonded to the electrode pads 140 and 150, respectively.

Since the solders 264 and 274 in a semi-molten state are partially inserted into the pad exposure holes and are then cured, they firmly fix the Cu pillars 262 and 272 to the electrode pads 150 and 140 at their accurate positions without sliding, respectively. After the compressive deformation, each of the cured solders 264 and 274 includes an inner solder portion inserted into the pad exposure hole and having the same diameter or the maximum width as that of the pad exposure hole and an outer solder portion in contact with the surface of the cell cover layer 160 around the pad exposure hole.

The micro-LED module includes a buffer layer 700 functioning as an energy-absorbing layer between the micro-LED 100 and the submount substrate 200. The buffer layer 700 is formed using an insulating adhesive material, such as an epoxy or silicone adhesive. When the sapphire substrate and the buffer layer are removed from the n-type semiconductor layer 132 of the micro-LED 100 mounted on the submount substrate 200 by a laser lift-off process, the buffer layer 700 enhances the bonding strength between the micro-LED 100 and the submount substrate 200 and protects a circuit of the submount substrate 200 between the neighboring LED cells 130 and the epilayer of the micro-LED 100, in which none of the LED cells are present, from laser-induced damage. In the case where the buffer layer 700 is not provided, the laser may cause damage to the thin epilayer and readily penetrates the epilayer to cause damage to a circuit of the submount substrate 200. In addition, the buffer layer 700 further enhances the bonding strength between the micro-LED 100 and the submount substrate 200 in addition to absorbing energy, as mentioned previously. The laser lift-off process is designed such that the tensile force applied between the micro-LED 100 and the submount substrate 200 is less than the bonding strength between the submount substrate 200 and the micro-LED 100 enhanced by the buffer layer 700, ensuring stable separation of the sapphire substrate.

The buffer layer 700 is completely filled between the micro-LED 100 and the submount substrate 200 to completely cover the side surfaces of the bonding connection members 260 and 270 connecting the electrode pads 150 and 140 to the electrodes 240 and 240'. The buffer layer 700 includes an inner side portion 710 and an outer side portion 720. The inner side portion 710 surrounds the inner bonding connection members 260 connecting the individual electrode pads 150 to the individual electrodes 240. The outer side portion 720 surrounds the outer bonding connection member 270 connecting the common electrode pad 140 to the common electrode 240' in the exposed area of the n-type semiconductor layer where the common electrode pad 140 is present.

The submount substrate 200 includes an empty area outside the area where the micro-LED 100 is mounted. Preferably, the buffer layer 700 further includes an outermost portion 730 surrounding the side surfaces of the micro-LED 100. The outermost portion 730 of the buffer layer 700 covers the side surfaces of the n-type semiconductor layer 132 at a height below the surface of the n-type semiconductor layer 132 from which the sapphire substrate is removed.

The construction of the micro-LED and the mounting of the micro-LED on the submount substrate will be explained sequentially below.

Construction of Micro-LED

With reference to FIGS. 2a to 2e, an explanation will be given concerning a process for constructing a micro-LED.

Figure 2A:
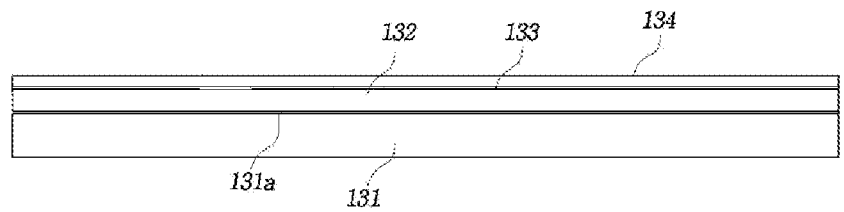
FIGS. 2a to 2e illustrate a process for constructing a micro-LED.

First, an epilayer including an n-type semiconductor layer 132, an active layer 133, and a p-type semiconductor layer 134 is formed on the primary surface of a sapphire substrate 131 as a growth substrate, as illustrated in FIG. 2a. The sapphire substrate 131 has a coefficient of thermal expansion of 7.6 $\mu mm^{-1}$ K.

Figure 2B:
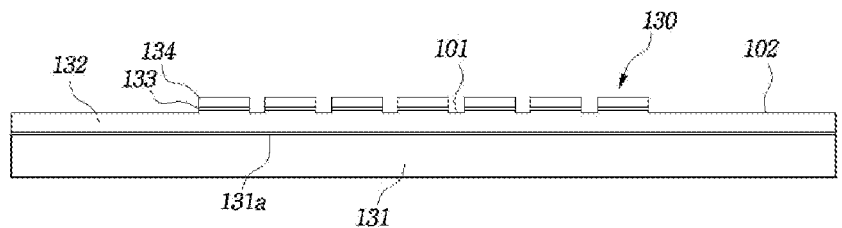

Next, the epilayer is etched to a predetermined depth using a mask pattern to form n-type trenches 101 and an n-type outer area 102, as illustrated in FIG. 2b. As a result of this etching, a plurality of LED cells 130 are formed. The plurality of LED cells 130 are separated by the n-type trenches 101 and are at least surrounded by the n-type outer area 102. Each of the LED cells 130 has a structure in which the active layer 133 and the p-type semiconductor layer 134 are formed on the n-type semiconductor layer 132. Other semiconductor layers having specific functions may be interposed between the n-type semiconductor layer 132 and the active layer 133, between the active layer 133 and the p-type semiconductor layer 134, and on the exposed surface of the p-type semiconductor layer 134.

Figure 2C:
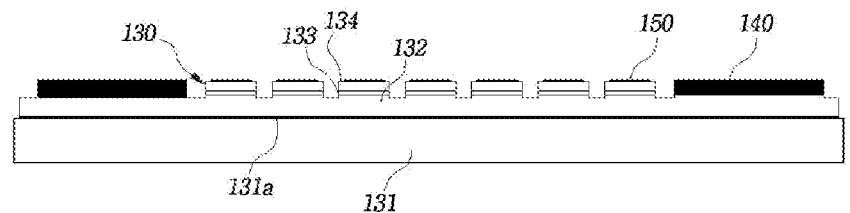

Next, a p-type individual electrode pad 150 is formed on each of the p-type semiconductor layers 134 of the LED cells 130 and an n-type common electrode pad 140 is formed at the periphery of the exposed area 102 of the n-type semiconductor layer 132, as illustrated in FIG. 2c. The p-type individual electrode pad 150 and the n-type common electrode pad 140 are designed to have different thicknesses. This design compensates for the step height between the p-type semiconductor layer 134 and the n-type semiconductor layer 132, and as a result, the end surface of the p-type individual electrode pad 150 lies in the same plane as that of the n-type common electrode pad 140.

Figure 2D:
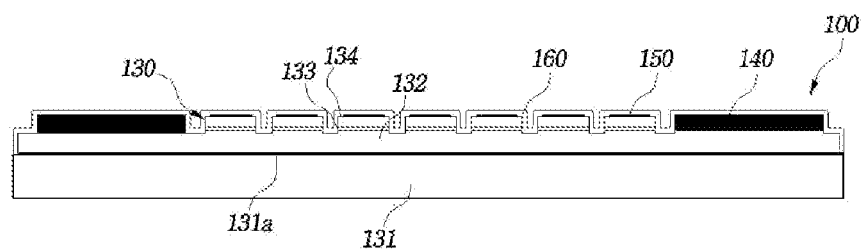

Next, an electrically insulating cell cover layer 160 is formed so as to cover the LED cells 130 and the exposed areas (including the n-type outer area and the n-type trenches) of the n-type semiconductor layer 132, as illustrated in FIG. 2d.

Figure 2E:
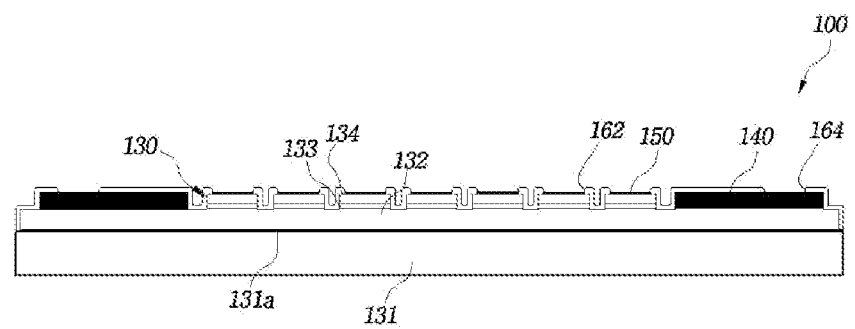

Next, first pad exposure holes 162 through which the p-type electrode pads 150 are exposed and a second pad exposure hole 164 through which the n-type common electrode pad 140 is exposed are formed, as illustrated in FIG. 2e. The first pad exposure holes 162 and the second pad exposure hole 164 may be formed by etching using a mask pattern. The cell cover layer 160 is formed to substantially the same thickness along the cross-sectional profile of the LED cells 130 such that the width and depth of the trenches 101 between the neighboring LED cells 130 decrease but the trenches remain unremoved. Alternatively, the cell cover layer 160 may completely fill the trenches 101.

The LED cells 130 of the constructed micro-LED 100 have a size of several to several tens of μm, preferably 5 μm or less. Thus, the p-type individual electrode pads 150 formed in the LED cells 130 have a size smaller than 5 μm.

Preparation of Submount Substrate and Formation of Bumps

Figure 3:
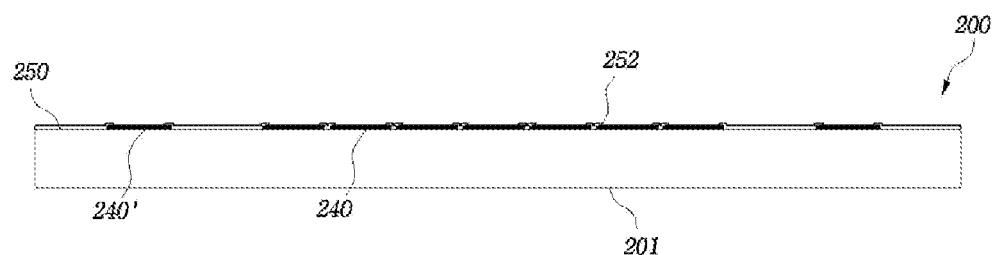
FIGS. 3 and 4 illustrate a process for forming bumps on a submount substrate.

Referring first to FIG. 3, a Si-based submount substrate 200 having a size of about 15,000 μm×10,000 μm is prepared, followed by the formation of pillar bumps. The submount substrate 200 may include a plurality of CMOS cells corresponding to the plurality of LED cells, a plurality of individual electrodes 240 corresponding to the p-type electrode pads of the micro-LED, and a common electrode 240' corresponding to the n-type electrode pad of the micro-LED. The plurality of electrodes 240 and 240' of the submount substrate 200 are arranged in a matrix on a Si-based substrate material 201 and are connected to the CMOS cells. An electrically insulating electrode cover layer 250 is formed so as to cover the electrodes 240 and 240'. The electrode cover layer 250 has electrode exposure holes 252 through which the individual electrodes 240 are exposed.

Bumps are formed by a process including the following steps: first scrubbing, under bump metallurgy (UBM) formation, photolithography, scum removal, Cu plating, solder metal plating, PR stripping, UBM etching, second scrubbing, reflow, and third scrubbing.

Figure 4:
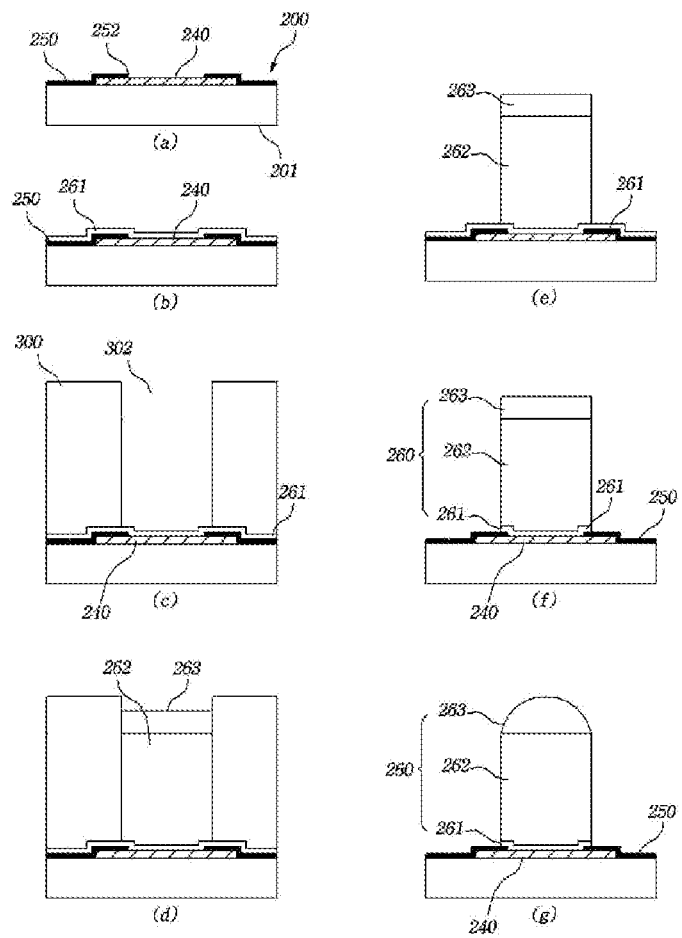

In the first scrubbing step, a submount substrate 200 is scrubbed with a scrubber, as illustrated in (a) of FIG. 4. In the submount substrate 200, a pad-type electrode 240 made of an Al or Cu material is formed on a substrate material 201 including CMOS cells and an electrode cover layer 250 having an electrode exposure hole 252 is formed on the substrate material 201. The CMOS cells are formed by a CMOS process and one area of the electrode 240 is exposed through the electrode exposure hole 252.

In the UBM formation step, a UBM 261 is formed on the submount substrate 200 to cover the electrode cover layer 250 and the electrode 240, as illustrated in (b) of FIG. 4. The UBM 261 serves to increase the adhesion of the electrode 240 to a Cu pillar and to prevent a solder from diffusing. The UBM 261 may have a layered structure of Ti/Cu and may be formed by sputtering the corresponding metals. It is noted that the UBM 261 may be a part of the electrode 240 in a broad sense.

In the photolithography step, a photoresist (PR) 300 is formed over the entire area of the UBM 261 on the submount substrate 200, as illustrated in (c) of FIG. 4. Thereafter, a mask pattern (not illustrated) is placed on the photoresist and light is applied to form an electrode exposure hole 302 through which only one area of the UBM 261 formed directly on the electrode 240 is exposed. Next, scum formed during the photolithography is removed.

Next, Cu is plated through the opening 302 of the PR 300 to form a Cu pillar 262 and then SnAg as a solder metal is plated on the Cu pillar 262 to form a SnAg solder 263 in the form of a layer with a predetermined thickness, as illustrated in (d) of FIG. 4. It is noted herein that Cu may be Cu metal or its alloy.

Next, the PR is stripped. As a result, the upper and side surfaces of a bump including the Cu pillar 262 and the solder 263 are exposed, as illustrated in (e) of FIG. 4.

Next, UBM etching is performed such that only the portion of the UBM 261 located directly under the Cu pillar 262 remains unremoved and the other portions of the UBM 261 are removed by etching, as illustrated in (f) of FIG. 4. Then, second scrubbing is carried out to remove residue. After the UBM etching, the resulting bump 260 has a structure in which the Cu pillar 262 and the solder cap 263 are sequentially stacked on the UBM 261 formed on the electrode 240 of the submount substrate 200. Next, reflow is performed. As a result, the solder 263 in the form of a layer is melted and cured to form a hemisphere. Alternatively, the solder 263 may have a shape whose cross-section is semicircular. Rapid thermal processing (RTP) is suitable for this reflow. Next, third scrubbing is performed to remove residue.

Preferably, the interval between the adjacent Cu pillar bumps 260 on the submount substrate 200 is substantially the same as the diameter of the Cu pillar 262. It is desirable that the interval between the adjacent Cu pillar bumps 260 does not exceed 5 μm. If the interval exceeds 5 μm, the diameter of the Cu pillar bumps 260 and the size of the LED cells corresponding thereto increase, resulting in a deterioration in the precision of a display including the micro-LED.

Mounting

Figure 5:
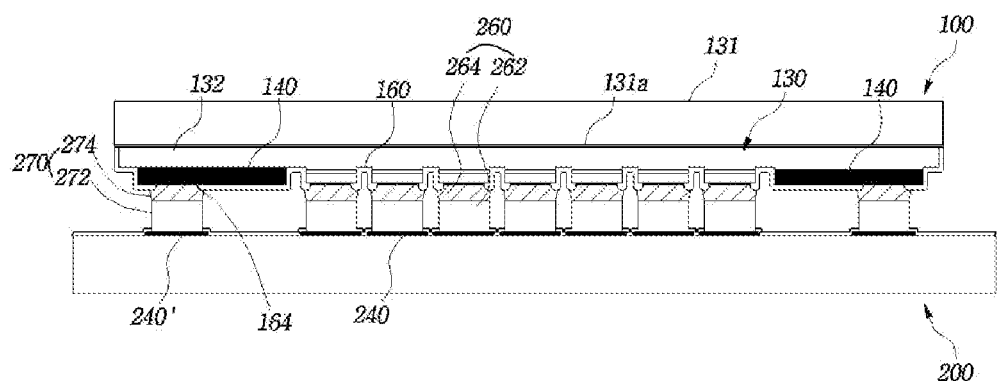
FIG. 5 illustrates a micro-LED mounting process in a method for fabricating a micro-LED module according to one embodiment of the present invention.
Figure 6:
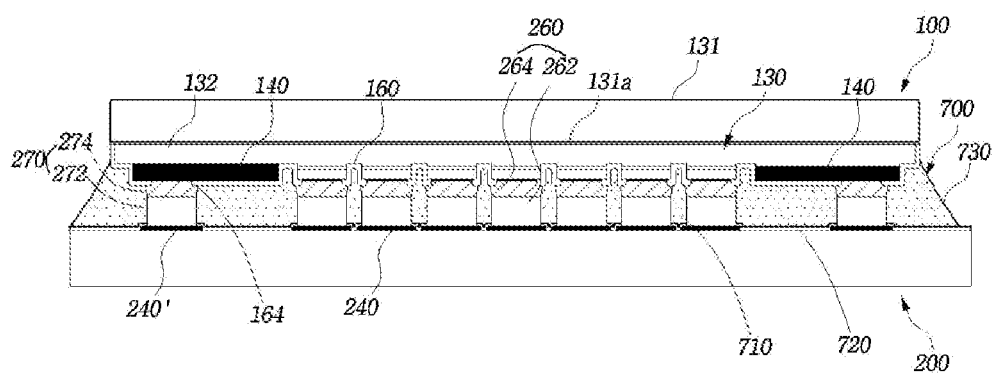
FIG. 6 illustrates a process for forming a buffer layer in a method for fabricating a micro-LED module according to one embodiment of the present invention.

Referring to FIG. 5, the micro-LED 100 based on the sapphire substrate 131 is flip-chip bonded to the submount substrate 200 based on the Si substrate material. The Si substrate material has a coefficient of thermal expansion of 2.6 µmm$^{-1}$ K and the sapphire substrate 131 has a coefficient of thermal expansion of 7.6 µmm$^{-1}$ K, which is about 2.5-fold higher than that of the Si substrate material.

As mentioned earlier, the plurality of electrodes of the submount substrate 200 are disposed corresponding to the electrode pads 150 of the micro-LED 100. The bumps 260 and 270 are formed on the plurality of electrodes. Each of the bumps 260 consists of the Cu pillar 262 and the SnAg solder 263.

The micro-LED 100 is flip-chip bonded to the submount substrate 200 through the bumps so that the electrode pads 150 of the micro-LED 100 are connected to the electrodes of the submount substrate 200. The solders 264 between the micro-LED 100 and the submount substrate 200, more specifically the solders 264 of the bumps 260 interposed between the electrode pads 150 formed in the LED cells 130 of the micro-LED 100 and the submount substrate 200 are heated to flip-chip bond the micro-LED 100 to the submount substrate 200.

According to one embodiment of the present invention, the electrode pads 150 are heated with a laser that is irradiated from above the micro-LED, penetrates the LED cells 130, and reaches the electrode pads 150. The solders are melted by the heated individual electrode pads and are then cured. This embodiment is very advantageous for flip-chip bonding of the micro-LED 100 to the submount substrate 200.

Formation of Buffer Layer

Figure 7:
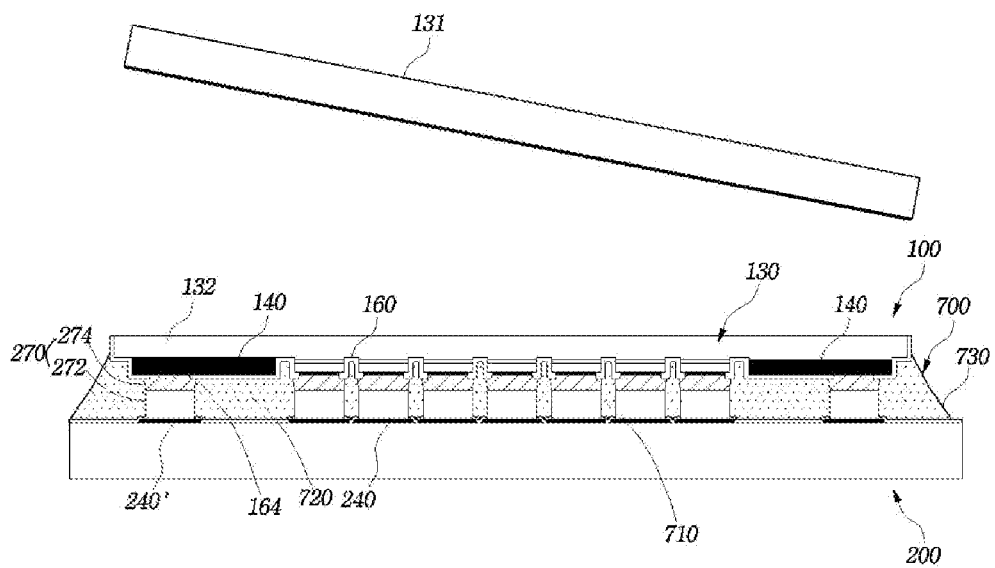
FIG. 7 illustrates a process for removing a sapphire substrate in a method for fabricating a micro-LED module according to one embodiment of the present invention.

Next, a buffer layer 700 is formed between the micro-LED 100 and the submount substrate 200, as illustrated in FIG. 7. The buffer layer 700 is formed by filling an adhesive (such as an epoxy or silicone adhesive) in the form of a liquid or gel is filled between the micro-LED 100 and the submount substrate 200 after the solders for forming the plurality of bonding connection members are melted and cured and curing the adhesive. As described in detail below, when the sapphire substrate and the buffer layer are removed from the n-type semiconductor layer 132 of the micro-LED 100 mounted on the submount substrate 200 by a laser lift-off process, the buffer layer 700 absorbs energy of the laser reaching the areas in which none of the LED cells are present, that is, the areas between the neighboring LED cells 130 and the n-type area surrounding the outermost ones of the LED cells, and protects a circuit of the submount substrate 200 and the epilayer of the micro-LED 100 from damage caused by the energy. Another role of the buffer layer 700 is to enhance the bonding strength between the micro-LED 100 and the submount substrate 200 when the sapphire substrate and the buffer layer are removed from the n-type semiconductor layer 132 of the micro-LED 100 by a laser lift-off process.

According to one embodiment of the present invention, the laser lift-off process is designed such that the tensile force applied between the micro-LED 100 and the submount substrate 200 is less than the bonding strength between the submount substrate 200 and the micro-LED 100 enhanced by the buffer layer 700, ensuring stable separation of the sapphire substrate.

The buffer layer 700 is completely filled between the micro-LED 100 and the submount substrate 200 to completely cover the side surfaces of the bonding connection members 260 and 270 connecting the electrode pads 150 and 140 to the electrodes 240 and 240'. The inner side portions 710 of the buffer layer 700 surrounds the inner bonding connection members 260 connecting the individual electrode pads 150 to the individual electrodes 240. The outer side portion 720 surrounds the outer bonding connection member 270 connecting the common electrode pad 140 to the common electrode 240' in the exposed area of the n-type semiconductor layer where the common electrode pad 140 is present.

The submount substrate 200 includes an empty area outside the area where the micro-LED 100 is mounted. The buffer layer 700 covers the outer side surfaces of the micro-LED 100 on the empty area of the submount substrate 200, more specifically partially covers the outer side surfaces of the n-type semiconductor layer 132. The outermost portion 730 of the buffer layer 700 covers the side surfaces of the n-type semiconductor layer 132 at a height below the boundary between the n-type semiconductor layer and the sapphire substrate. If a portion of the buffer layer 700 is in contact with the submount substrate 200, the submount substrate 200 may be difficult to separate. Thus, it is necessary to determine the height of the buffer layer 700 such that the buffer layer 700 is not in contact with the submount substrate 200. The outermost portion 730 of the buffer layer 700 protects the epilayer in the n-type area where none of the LED cells are present around the plurality of LED cells 130 from laser-induced damage or the submount substrate from damage caused when a circuit of the submount substrate is heated by the laser passing through the epilayer in the n-type area.

Removal of the Sapphire Substrate

In a state in which the micro-LED 100 is mounted on the submount substrate 200 and the buffer layer 700 is interposed between the micro-LED and the submount substrate 200, a laser lift-off process is carried out such that the laser is absorbed by a GaN buffer layer 131a between the sapphire substrate 131 and the n-type semiconductor layer 132 to remove the sapphire substrate 131. The laser is irradiated onto the GaN buffer layer 131a through the sapphire substrate 131. The laser is absorbed by the GaN buffer layer or undoped GaN layer 131a but is not absorbed by the sapphire substrate 131. The laser absorbed by the GaN buffer layer or undoped GaN layer 131a is decomposed into liquid-Ga and N$_2$, with the result that the sapphire substrate 131 can be separated from the micro-LED 100.

When the sapphire substrate 131 is separated from the n-type semiconductor layer 132 of the micro-LED 100 by the laser lift-off process, the areas in which none of the LED cells are present absorb the majority of energy generated by the laser. Therefore, the buffer layer 700 protects the micro-LED 100 and the submount substrate 200 from laser-induced damage. In addition, the buffer layer 700 enhances the bonding strength between the micro-LED 100 and the submount substrate 200. Furthermore, the laser lift-off process is designed such that the tensile force applied between the micro-LED 100 and the submount substrate 200 is less than the bonding strength between the submount substrate 200 and the micro-LED 100 enhanced by the buffer layer 700, ensuring stable separation of the sapphire substrate.

Further Embodiment

Figure 8:
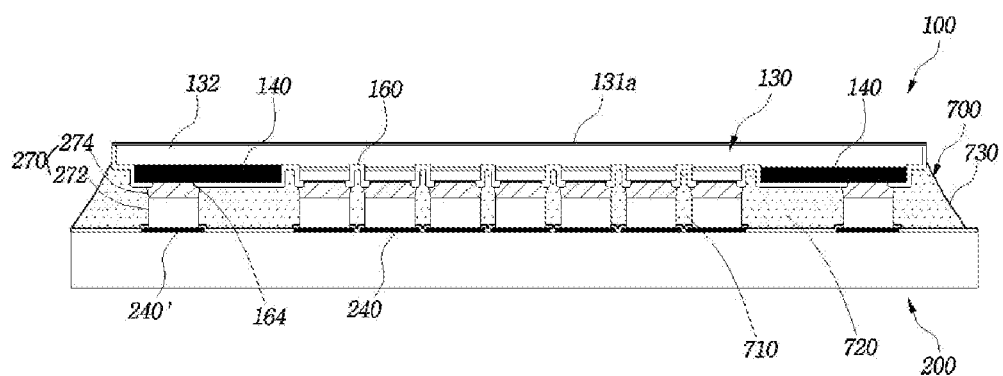
FIG. 8 illustrates a further embodiment of the present invention.

FIG. 8 illustrates a micro-LED module according to a further embodiment of the present invention. Referring to FIG. 8, when the sapphire substrate 131 is removed, a portion of the buffer layer or undoped semiconductor layer 131a and the other portion of the buffer layer or undoped semiconductor layer 131a remains unremoved on the n-type semiconductor layer 132. That is, the buffer layer or undoped semiconductor layer 131a is exposed by removal of the sapphire substrate 131 in this embodiment. In contrast, the n-type semiconductor layer 132 is exposed by removal of the sapphire substrate 131 in the previous embodiment.

Alternatively, the sapphire substrate together with a portion of the buffer layer or undoped semiconductor layer may be removed by the laser and the buffer layer or undoped semiconductor layer remaining unremoved on the epilayer may be removed by etching.

What is claimed is:

1. A method for fabricating a micro-LED module, comprising:
    preparing a micro-LED in which a semiconductor layer is formed on a sapphire substrate, a plurality of LED cells are formed on the semiconductor layer, and a plurality of electrode pads are disposed such that one electrode pad is assigned to each LED cell;
    preparing a submount substrate comprising a plurality of electrodes corresponding to the electrode pads;
    mounting the micro-LED on the submount substrate such that the plurality of electrode pads are connected to the plurality of electrodes through a plurality of bonding connection members;
    forming a buffer layer between the micro-LED and the submount substrate; and
    irradiating a laser between the sapphire substrate and the semiconductor layer to separate the semiconductor layer from the sapphire substrate,
    wherein the buffer layer absorbs energy produced by the laser at least between the neighboring LED cells, and
    wherein the micro-LED preparation comprises:
        forming an undoped semiconductor layer, an n-type semiconductor layer, an active layer, and a p-type semiconductor layer as constituent parts of the semiconductor layer and etching the semiconductor layer to a predetermined depth to form n-type trenches isolating a plurality of LED cells and an n-type outer area surrounding the outermost ones of the plurality of LED cells; and
        forming an individual electrode pad on the p-type semiconductor layer of each of the plurality of LED cells and forming a common electrode pad on the n-type outer area, and the submount substrate preparation comprises forming individual electrodes corresponding to the individual electrode pads and a common electrode corresponding to the common electrode pad.

2. The method according to claim 1, wherein the buffer layer comprises an inner side portion surrounding inner bonding connection members connecting the plurality of individual electrode pads to the plurality of individual electrodes and an outer side portion surrounding an outer bonding connection member connecting the common electrode pad to the common electrode.

3. The method according to claim 1, wherein the buffer layer comprises an outermost portion surrounding the side surfaces of the micro-LED.

4. The method according to claim 1, wherein the buffer layer formation comprises:
    filling an adhesive in the form of a liquid or gel between the micro-LED and the submount substrate after solders for forming the plurality of bonding connection members are melted and cured; and
    curing the adhesive.

5. The method according to claim 1, wherein the micro-LED preparation comprises designing the individual electrode pads and the common electrode pad to have different thicknesses such that the end surfaces of the individual electrode pads lie in the same plane as the end surface of the common electrode pad.

6. The method according to claim 1, wherein the micro-LED preparation further comprises forming an electrically insulating cell cover layer comprising first pad exposure holes through which the individual electrode pads are exposed and a second pad exposure hole through which the common electrode pad is exposed.

7. The method according to claim 1, wherein the sapphire substrate removal comprises removing the sapphire substrate together with the undoped semiconductor layer by irradiation with a laser at a wavelength that passes through the sapphire substrate and is absorbed by the undoped semiconductor layer and removing the undoped semiconductor layer remaining in the epilayer by etching.

8. The method according to claim 1, wherein the buffer layer is formed at a height below the boundary between the n-type semiconductor layer and the sapphire substrate to cover the side surfaces of the n-type semiconductor layer.

9. The method according to claim 1, wherein each of the plurality of bonding connection members comprises a solder and the micro-LED mounting comprises heating the individual electrode pads with a laser that is irradiated from above the micro-LED, penetrates the LED cells, and reaches the individual electrode pads to melt the solders.

10. A method for fabricating a micro-LED module, comprising:
    preparing a micro-LED in which a semiconductor layer is formed on a sapphire substrate, a plurality of LED cells are formed on the semiconductor layer, and a plurality of electrode pads are disposed such that one electrode pad is assigned to each LED cell;
    preparing a submount substrate comprising a plurality of electrodes corresponding to the electrode pads;
    mounting the micro-LED on the submount substrate such that the plurality of electrode pads are connected to the plurality of electrodes through a plurality of bonding connection members;
    forming a buffer layer between the micro-LED and the submount substrate; and
    irradiating a laser between the sapphire substrate and the semiconductor layer to separate the semiconductor layer from the sapphire substrate,
    wherein the sum of the bonding strength between the micro-LED and the sub-mount through the plurality of bonding connection members and the bonding strength between the micro-LED and the submount substrate through the buffer layer is greater than the tensile strength between the submount substrate and the micro-LED when the sapphire substrate is removed.

11. The method according to claim 10, wherein the micro-LED preparation comprises:
    forming an undoped semiconductor layer, an n-type semiconductor layer, an active layer, and a p-type semiconductor layer as constituent parts of the semiconductor layer and etching the semiconductor layer to a predetermined depth to form n-type trenches isolating a plurality of LED cells and an n-type outer area surrounding the outermost ones of the plurality of LED cells; and
    forming an individual electrode pad on the p-type semiconductor layer of each of the plurality of LED cells and forming a common electrode pad on the n-type outer area, and the submount substrate preparation comprises forming individual electrodes corresponding to the individual electrode pads and a common electrode corresponding to the common electrode pad.

12. The method according to claim 11, wherein the buffer layer comprises an inner side portion surrounding inner bonding connection members connecting the plurality of individual electrode pads to the plurality of individual electrodes and an outer side portion surrounding an outer bonding connection member connecting the common electrode pad to the common electrode.

13. The method according to claim 10, wherein the buffer layer comprises an outermost portion surrounding the side surfaces of the micro-LED.

14. The method according to claim 10, wherein the buffer layer formation comprises:
    filling an adhesive in the form of a liquid or gel between the micro-LED and the submount substrate after solders for forming the plurality of bonding connection members are melted and cured; and
    curing the adhesive.

15. The method according to claim 11, wherein the micro-LED preparation comprises designing the individual electrode pads and the common electrode pad to have different thicknesses such that the end surfaces of the individual electrode pads lie in the same plane as the end surface of the common electrode pad.

16. The method according to claim 11, wherein the micro-LED preparation further comprises forming an electrically insulating cell cover layer comprising first pad exposure holes through which the individual electrode pads are exposed and a second pad exposure hole through which the common electrode pad is exposed.

17. The method according to claim 11, wherein the sapphire substrate removal comprises removing the sapphire substrate together with the undoped semiconductor layer by irradiation with a laser at a wavelength that passes through the sapphire substrate and is absorbed by the undoped semiconductor layer and removing the undoped semiconductor layer remaining in the epilayer by etching.

18. The method according to claim 11, wherein the buffer layer is formed at a height below the boundary between the n-type semiconductor layer and the sapphire substrate to cover the side surfaces of the n-type semiconductor layer.

19. The method according to claim 10, wherein each of the plurality of bonding connection members comprises a solder and the micro-LED mounting comprises heating the individual electrode pads with a laser that is irradiated from above the micro-LED, penetrates the LED cells, and reaches the individual electrode pads to melt the solders.

* * * * *